(12) United States Patent
Abiko

(10) Patent No.: US 7,701,026 B2
(45) Date of Patent: Apr. 20, 2010

(54) IMAGING DEVICE

(75) Inventor: Hitoshi Abiko, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/712,976

(22) Filed: Mar. 2, 2007

(65) Prior Publication Data

US 2007/0215922 A1  Sep. 20, 2007

(30) Foreign Application Priority Data

Mar. 20, 2006  (JP) ............................. 2006-076557

(51) Int. Cl.
*H01L 31/0203* (2006.01)
(52) U.S. Cl. .................. 257/443; 257/447; 257/228; 257/E31.097; 257/E27.133; 438/75
(58) Field of Classification Search .............. 257/447, 257/443, 228, 460, E31.097, E27.133; 438/75
See application file for complete search history.

(56) References Cited

U.S. PATENT DOCUMENTS

| 6,168,965 | B1 | 1/2001 | Malinovich et al. |
| 6,246,098 | B1 * | 6/2001 | Paniccia ..................... 257/437 |
| 7,015,579 | B2 | 3/2006 | Okada et al. |
| 7,030,919 | B2 | 4/2006 | Ohkubo et al. |
| 2008/0011959 | A1 * | 1/2008 | Thorne .................. 250/370.09 |

FOREIGN PATENT DOCUMENTS

| JP | 2002-033469 A | 1/2002 |
| JP | 2004-304054 A | 10/2004 |

* cited by examiner

*Primary Examiner*—Cuong Q Nguyen
*Assistant Examiner*—Cathy N Lam
(74) *Attorney, Agent, or Firm*—Foley & Lardner LLP

(57) ABSTRACT

A backside imaging device includes a bump that is disposed overlapping with a sensor array region or a photodiode in a planar view. By this configuration, the bump becomes a support, and the semiconductor substrate is prevented from being damaged because of a bending applied to the semiconductor substrate.

20 Claims, 2 Drawing Sheets

IMAGING DEVICE

BACKGROUND OF THE INVENTION

1. Field of the Invention

The present invention relates to an imaging device, and particularly to an imaging device connected to another apparatus or a substrate using a bump.

2. Description of Related Art

Up to now, an image sensor using a semiconductor chip including a CMOS (Complementary Metal Oxide Semiconductor) image sensor is known. Further, a finger certification device is made up using such image sensor. Especially in recent years, in light of information protection, fingerprint certification devices mounted to small devices including a cellular phone are under development.

Image sensors for fingerprint certification devices are disclosed in Japanese Unexamined Patent Application Publication No. 2004-304054 and Japanese Unexamined Patent Application Publication No. 2002-33469.

For example FIG. 4 (not shown) of Japanese Unexamined Patent Application Publication No. 2004-304054 is a cross-sectional diagram showing a conventional image sensor for a fingerprint certification device. In a fingerprint sensor 20A of FIG. 4, a sensor section 26 is provided on a semiconductor chip 22A. The semiconductor chip 22A is connected to a circuit substrate 23A using a stud bump 37. This stud bump 37 is provided at a surface of the semiconductor chip 22A where the sensor section 26 is provided. An opening 29 is provided at the circuit substrate 23A. The sensor 26 is touched by a finger via the opening 29, and a fingerprint image is pictured.

On the other hand, an image sensor that detects a light entered from a backside of a semiconductor chip is also under development. Such devices are disclosed in Japanese Unexamined Patent Application Publication No. 2002-33469 and U.S. Pat. Publication No. 6,168,965.

In a MOS (Metal Oxide Semiconductor) image sensor chip of FIG. 1 disclosed in Japanese Unexamined Patent Application Publication No. 2002-33469, a light-receiving diffusion layer 5 is provided over a downside surface of a Si substrate (semiconductor chip) 1. The light-receiving diffusion layer 5 converts a light 32 entered from the backside of the Si substrate, and an image is pictured. An image sensor that takes an image by capturing a light entered from a backside thereof is hereinafter referred to as a backside image sensor.

A backside image sensor is disclosed in U.S. Pat. Publication No. 6,168,965.

However the inventor discovered that there is a following problem in the abovementioned technique.

In a fingerprint sensor 20A shown in FIG. 4 of Japanese Unexamined Patent Application Publication No. 2004-304054, a stud bump 37 is provided at an edge of a semiconductor chip but not near the center. This is because, in the fingerprint sensor 20A, an image is taken by capturing a light entered from a light entering surface of the semiconductor chip where the sensor 26 is provided. And if the stud bump 27 is provided over the light entering surface of the semiconductor chip 22A, a light to be detected is blocked by the stud bump 27.

However, if providing a bump at an end of a semiconductor chip of a backside image sensor, a problem of tolerance arises.

Specifically, both edges of the semiconductor chip are supported by bumps, thus the semiconductor chip could bend when the sensor section is pressed by a finger, and the semiconductor chip could possibly be damaged.

If there is no opening provided at the circuit substrate 23A of FIG. 4 disclosed in Japanese Unexamined Patent Application Publication No. 2004-304054, and an under fill material filled between the semiconductor chip 22A and the circuit substrate 23A, it is inevitable for a semiconductor chip to be bent because the under fill material is softer than the bump in general.

SUMMARY OF THE INVENTION

According to an aspect of the present invention, there is provided an imaging device that includes a semiconductor substrate having a first main surface and a second main surface, the second main surface is opposite to the first main surface and is passed by a light to be detected, a plurality of photodiodes formed on the first main surface of the semiconductor substrate, a wiring layer provided on the first main surface of the semiconductor substrate, and a plurality of bumps provided on the wiring layer, wherein at least one of the plurality of bumps is disposed overlapping with one of the plurality of photodiodes in a planar view.

According to an aspect of the present invention, there is provided an imaging device that includes a semiconductor substrate having a first main surface and a second main surface, the second main surface is opposite to the first main surface and is passed by a light to be detected, a sensor array region formed on the first main surface of the semiconductor substrate, a wiring layer provided on the first main surface of the semiconductor substrate, and a plurality of bumps provided on the wiring layer, wherein at least one of the plurality of bumps is disposed overlapping with the sensor array region in a planar view.

According to an aspect of the present invention, there is provided an imaging device that includes a semiconductor substrate having a first main surface, which has a first region where a plurality of photodiodes are formed, and a second main surface opposite to the first main surface and passed by a light to be detected, and a plurality of bumps provided over the first region of the first main surface of the semiconductor substrate, wherein a second region where the plurality of bumps are provided is not smaller than the first region where the plurality of photodiodes are formed.

The present invention prevents a semiconductor chip from being damaged. Because the bend of the semiconductor chip can be suppressed by the bumps disposed overlapping the photodiode in a planar view. That is, the bumps function as a support when a rear surface of the semiconductor chip is pressed by the finger.

The present invention enables to suppress a semiconductor substrate from bending and being damaged when a backside image sensor is pressed by a finger.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

An embodiment of the present invention is described hereinafter in detail with reference to FIGS. 1 and 2. In this embodiment, a CMOS image sensor is used to explain as an example.

Figure 1:
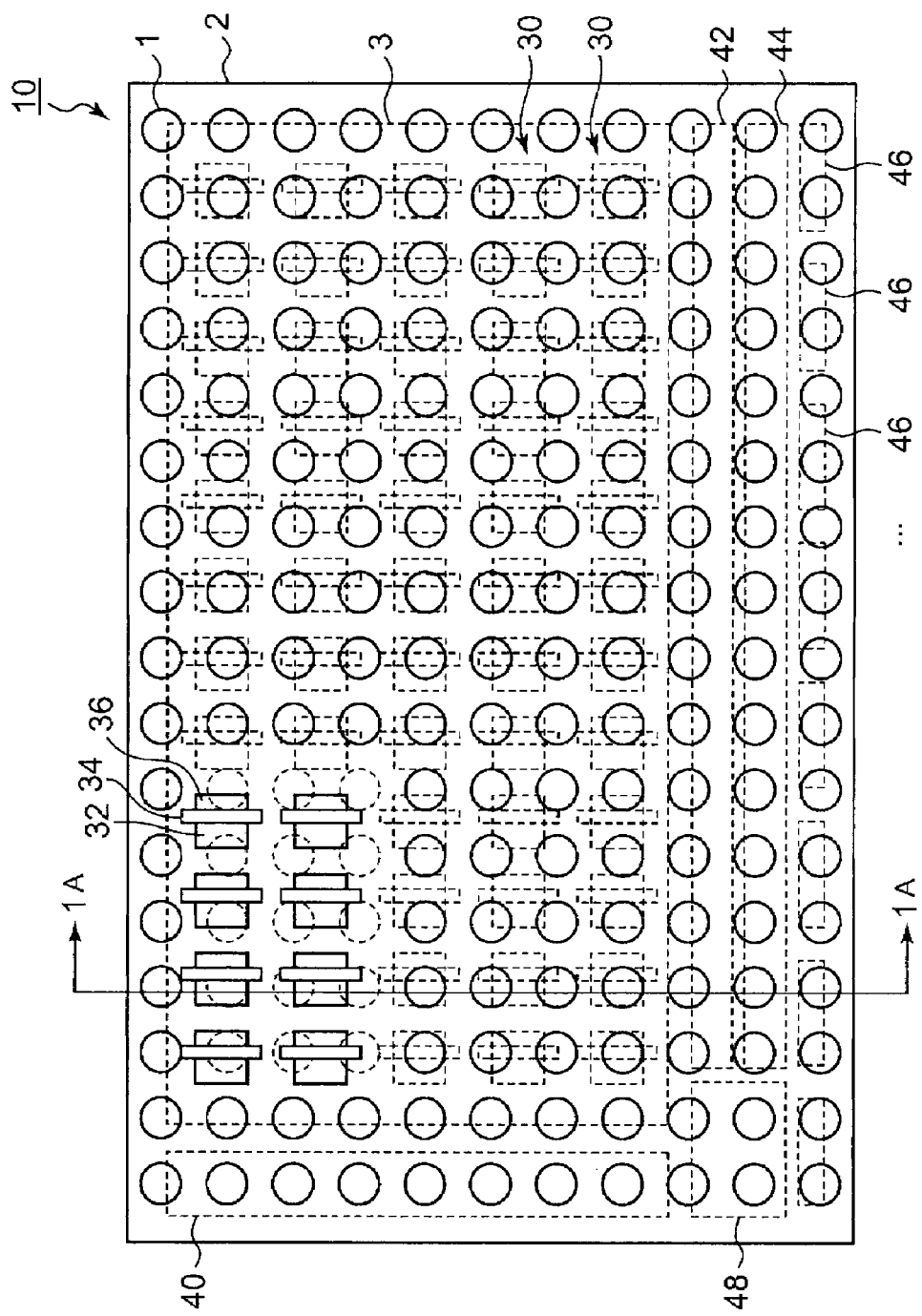
FIG. 1 is a schematic plan view showing an imaging device according to the present invention.

FIG. 1 is a schematic diagram showing a backside imaging device 10 of this embodiment viewed from a side where bumps 1 are formed thereto. In this embodiment, the bump 1 is explained as a solder bump. FIG. 2 is a schematic diagram showing a semiconductor apparatus taken along the line 1A-1A of FIG. 1.

As shown in FIG. 1, the imaging device of rear type of this embodiment includes a semiconductor substrate 2, a sensor array region 3, a column decoder 40, a row decoder 42, a sense amplifier 44, an I/O region 46, and other peripheral circuitry 48. The sensor array region 3 is formed over a surface 22, which is a first main surface of the semiconductor substrate 2. The I/O region 46 is used to output an image signal. In this embodiment, a conductive type of the semiconductor substrate 2 is P-type.

A plurality of sensors 30 are formed in the sensor array region 3. Each of the sensors 30 includes a light receiving N type region 32, a gate electrode 34, and an N type source/drain region 35. A photodiode is constituted with the semiconductor substrate 2 and the N type region 32. A charge generated due to a photoelectric conversion is accumulated in the light receiving N type region 32. The gate electrode 34 and the source/drain region 35 are used to discharge the charges accumulated in the light-receiving N type region 32. Other circuits (not shown) such as an amplifier device is connected to each of the sensors 30.

Figure 2:
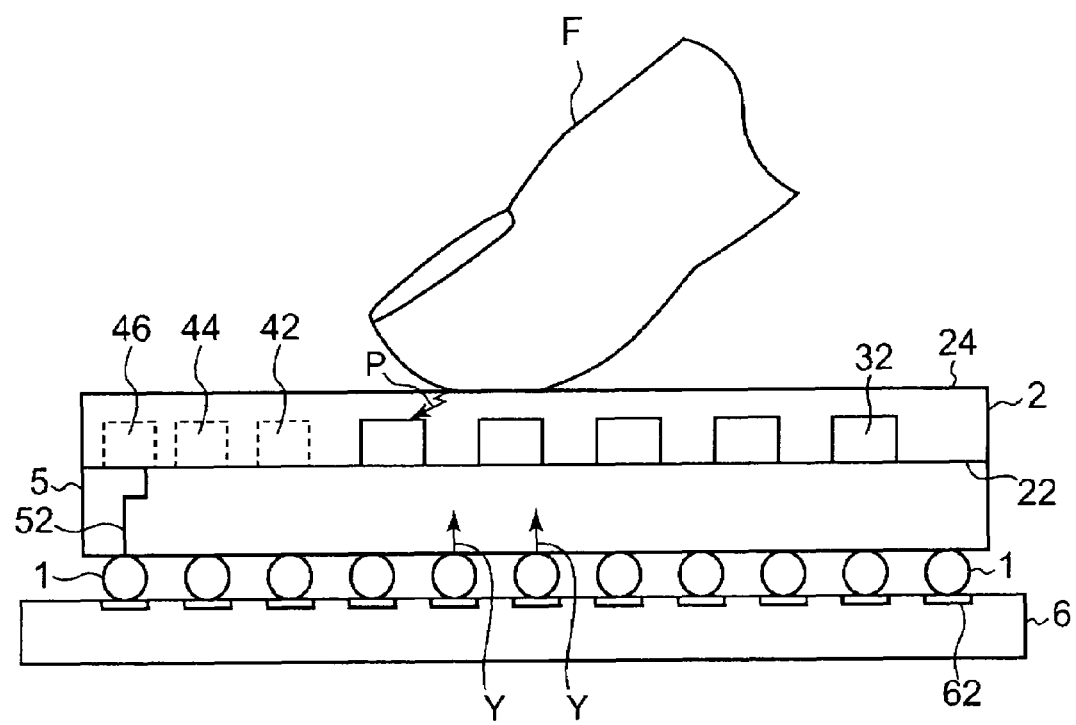
FIG. 2 is a schematic cross-sectional diagram taken along the line 1A-1A of FIG. 1.

Further as shown in FIG. 2, the light-receiving N type region 32, row decoder 42, sense amplifier 44, and I/O region 46 are formed over the surface 22 of the semiconductor substrate 2. Further, a wiring layer 5 is formed over the surface 22 of the semiconductor 2. Furthermore, a plurality of solder bumps 1 are formed over the wiring layer 5. Specifically, the solder bumps 1 are formed over the surface 22 of the semiconductor 2.

A line 52 is formed in the wiring layer 5. The line 52 is electrically connecting the solder bumps 1 and I/O region 46, for example.

The backside imaging device 10 is connected to a mounting substrate 6. Electrode pads 62 are provided on the mounting substrate 6. The solder bumps 1 are joined with the electrode pads 62.

A light P to be detected enters from a backside 24, which is a second main surface of the semiconductor substrate 2. An electron-hole pair is generated in the semiconductor substrate 2 by a photoelectric conversion. The generated electron is accumulated in the light-receiving N type region 32 and reduces a potential of the light-receiving N type region 32. The light intensity entered is measured by detecting a change of the potential to take an image.

Turning back to FIG. 1, there are some solder bumps 1 that are formed overlapping the sensor array region 3 in a planar view (a position overlapping a region in a planar view hereinafter refers to a position overlapping the region). Further, there are some solder bumps overlap the photodiode constituted from the light-receiving N type region 32 and the semiconductor substrate 2. In the backside imaging device 10, a light to be detected enters from the backside 24. Accordingly even if the solder bumps 1 are disposed overlapping the sensor array region 3 and the photodiode constituted from the light-receiving N type region 32 and the semiconductor substrate 2, the light to be detected is not blocked.

By having such configuration, when a finger F is placed at the backside 24 of the semiconductor substrate 2 so as to take a fingerprint by the backside imaging device 10, it is possible to suppress the semiconductor substrate 2 to be bent. This is because that the solder bumps 1, which are disposed overlapping the sensor array region 3 and the light-receiving N type region 32, support the semiconductor substrate 2. The arrow Y of FIG. 2 indicates a force the solder bumps support the semiconductor substrate 2. And, the semiconductor substrate 2 is prevented to be damaged.

Note that in this embodiment, the solder bumps 1 are disposed at substantially equal intervals substantially all over the surface 22 of the semiconductor substrate 2. This sufficiently achieves an advantageous effect that the solder bumps 1 suppress the semiconductor substrate 2 to be bent.

Furthermore, there are some solder bumps 1 that are disposed not overlapping the sensor array region 3. For example, it is preferable that the solder bumps 1 used for outputting an image signal are disposed overlapping the I/O region 46 so as to transmit signals at high speeds.

According to this embodiment, even when a large number of solder bumps are required for various signals including an image signal to be output and a control signal for a column and row decoder, it is possible to suppress an area of an imaging device to be increased. This is because that an area for solder bumps needs not to be prepared outside the sensor array region because the solder bumps are disposed inside the sensor array region.

On the other hand if various signals are input/output serially, the number of solder bumps 1 that are used for input/output signals may be smaller. In such case, the solder bumps 1 that are disposed overlapping the sensor array region 3 and the light-receiving N type region 32 need not to be used for inputting/outputting various signals including an image and control signals. Accordingly in this case, the solder bumps disposed overlapping the sensor array region 3 and the light-receiving N type region 32 may be floating potentials, ground potentials, or power supply potentials including a driving potential that is supplied to the backside imaging device 10.

It is apparent that the present invention is not limited to the above embodiment and it may be modified and changed without departing from the scope and spirit of the invention.

What is claimed is:
1. An imaging device comprising:
a semiconductor substrate having a first main surface and a second main surface, the second main surface is opposite to the first main surface and is passed by a light to be detected,
a plurality of photodiodes formed on the first main surface of the semiconductor substrate,
a wiring layer provided on the first main surface of the semiconductor substrate, and
a plurality of bumps provided on the wiring layer,
wherein at least one of the plurality of bumps is disposed overlapping with one of the plurality of photodiodes in a planar view,
wherein a peripheral circuitry is formed at a region of the first main surface of the semiconductor substrate where the plurality of photodiodes are not formed, and
at least one of the plurality of bumps is disposed overlapping with the periphery circuit in, and
wherein the peripheral circuitry includes a row decoder, a sense amplifier, and an I/O circuit.

2. The imaging device according to claim 1, wherein the plurality of photodiodes are formed at the first main surface at an equal interval.

3. The imaging device according to claim 1, wherein the plurality of bumps are provided on the wiring layer at an equal interval.

4. The imaging device according to claim 1, wherein the plurality of bumps are solder bumps.

5. The imaging device according to claim 1, wherein at least one of the plurality of bumps is disposed overlapping with a region where the periphery circuit is formed and also not overlapping with the photodiodes in.

6. The imaging device according to claim 1, wherein the bump, which is disposed overlapping with the photodiode in, is not used to output an image signal.

7. The imaging device according to claim 6, wherein the bump, which is disposed overlapping with the photodiode in, is connected to a power supply potential.

8. The imaging device according to claim 7, wherein the power supply potential is a ground potential.

9. The imaging device according to claim 6, wherein the bump, which is disposed overlapping with the photodiodes in a planar view, is set floating potential.

10. The imaging device according to claim 1, wherein the plurality of bumps are directly bonded to an electric component.

11. An imaging device comprising:
a semiconductor substrate having a first main surface and a second main surface, the second main surface is opposite to the first main surface and is passed by a light to be detected,
a sensor array region formed on the first main surface of the semiconductor substrate,
a wiring layer provided on the first main surface of the semiconductor substrate, and
a plurality of bumps provided on the wiring layer,
wherein at least one of the plurality of bumps is disposed overlapping with the sensor array region in a planar view,
wherein a peripheral circuitry is formed at a region of the first main surface of the semiconductor substrate where the sensor array region is not formed, and
at least one of the plurality of bumps is disposed overlapping with the periphery circuit in, and
wherein the peripheral circuitry includes a row decoder, a sense amplifier, and an I/O circuit.

12. The imaging device according to claim 11, wherein the sensor array region has a plurality of photodiodes disposed two-dimensionally.

13. The imaging device according to claim 11, wherein the plurality of bumps are disposed two-dimensionally at equal interval.

14. An imaging device comprising:
a semiconductor substrate having a first main surface, which has a first region where a plurality of photodiodes are formed, and a second main surface opposite to the first main surface and passed by a light to be detected, and
a plurality of bumps provided over the first region of the first main surface of the semiconductor substrate,
wherein a second region where the plurality of bumps are provided is not smaller than the first region where the plurality of photodiodes are formed,
wherein a peripheral circuitry is formed at a region of the first main surface of the semiconductor substrate where the plurality of photodiodes are not formed, and
at least one of the plurality of bumps is disposed overlapping with the periphery circuit in a planar view, and
wherein the peripheral circuitry includes a row decoder, a sense amplifier, and an I/O circuit.

15. The imaging device according to claim 14, further comprising a wiring layer interposed between the semiconductor substrate and the plurality of bumps.

16. The imaging device according to claim 1, further comprising:
a mounting substrate having a surface that faces the semiconductor substrate, in which a plurality of electrode pads are provided on the first surface of the mounting substrate,
wherein the plurality of bumps directly connect the plurality of electrode pads to the wiring layer.

17. The imaging device according to claim 1, wherein the wiring layer is interposed directly between the first main surface of the semiconductor substrate and the plurality of bumps.

18. The imaging device according to claim 14, further comprising
a mounting substrate having a surface that faces the semiconductor substrate, in which a plurality of electrode pads are provided on the first surface of the mounting substrate; and
a wiring layer interposed directly between the first main surface of the semiconductor substrate and the plurality of bumps,
wherein the plurality of bumps directly connect the plurality of electrode pads to the wiring layer.

19. The imaging device according to claim 1, wherein the row decoder, the sense amplifier, and the I/O circuit are provided as separate rows on the first main surface of the semiconductor substrate.

20. The imaging device according to claim 11, wherein the row decoder, the sense amplifier, and the I/O circuit are provided as separate rows on the first main surface of the semiconductor substrate.

* * * * *